(12) United States Patent
Miller et al.

(10) Patent No.: US 9,077,368 B2
(45) Date of Patent: *Jul. 7, 2015

(54) EFFICIENT TECHNIQUES FOR ALIGNED FIXED-LENGTH COMPRESSION

(71) Applicant: PURE STORAGE, INC., Mountain View, CA (US)

(72) Inventors: Ethan Miller, Santa Cruz, CA (US); John Colgrove, Los Altos, CA (US); John Hayes, Mountain View, CA (US)

(73) Assignee: Pure Storage, Inc., Mountain View, CA (US)

( * ) Notice: Subject to any disclaimer, the term of this patent is extended or adjusted under 35 U.S.C. 154(b) by 51 days.

This patent is subject to a terminal disclaimer.

(21) Appl. No.: 13/953,345

(22) Filed: Jul. 29, 2013

(65) Prior Publication Data

US 2013/0307709 A1 Nov. 21, 2013

Related U.S. Application Data

(63) Continuation of application No. 13/455,846, filed on Apr. 25, 2012, now Pat. No. 8,497,788.

(51) Int. Cl.
*H03M 7/30* (2006.01)
(52) U.S. Cl.
CPC .............. *H03M 7/30* (2013.01); *H03M 7/3093* (2013.01)
(58) Field of Classification Search
USPC ..................................................... 341/51, 87
See application file for complete search history.

(56) References Cited

U.S. PATENT DOCUMENTS

| 5,635,932 | A | 6/1997 | Shinagawa et al. |
| 7,382,878 | B2 | 6/2008 | Volpert, Jr. |
| 7,565,681 | B2 | 7/2009 | Ngo et al. |
| 8,044,829 | B2 * | 10/2011 | Chen et al. ...................... 341/51 |
| 8,355,584 | B2 | 1/2013 | Kodama |
| 8,363,837 | B2 | 1/2013 | Williams |
| 8,497,788 | B1 * | 7/2013 | Miller et al. .................... 341/87 |

OTHER PUBLICATIONS

Vitter, Jeffrey Scott, "Design and Analysis of Dynamic Huffman Codes", Journal of the Association for Computing Machinery, Oct. 1987, pp. 825-845, vol. 34, No. 4, ACM, New York, NY, USA.

* cited by examiner

*Primary Examiner* — Khai M Nguyen
(74) *Attorney, Agent, or Firm* — Edward J. Lenart; Kennedy Lenart Spraggins LLP

(57) ABSTRACT

Systems and methods for performing compression of data. A data buffer is separated into equal-sized segments of data. A frequency count is performed to determine how often each segment of data appears in the data buffer. Frequently occurring segments are encoded with unique compression codes, while all other infrequently occurring segments are encoded with a common compression code. The compressed data buffer includes the compression codes, which are all of the same bit-length, and the uncompressed segments. The compression codes and the uncompressed segments are stored in the compressed data buffer in the order in which the corresponding segments appear in the original data buffer.

21 Claims, 11 Drawing Sheets

Frequency
Count
700

| Segment Value | Number of Occurrences |
|---|---|
| A | 4 |
| B | 4 |
| C | 3 |
| D | 1 |
| E | 1 |
| F | 1 |
| G | 1 |
| H | 1 |

EFFICIENT TECHNIQUES FOR ALIGNED FIXED-LENGTH COMPRESSION

This application is a continuation of U.S. patent application Ser. No. 13/455,846, entitled "EFFICIENT TECHNIQUES FOR ALIGNED FIXED-LENGTH COMPRESSION", filed Apr. 25, 2012, the entirety of which is incorporated herein by reference.

BACKGROUND

1. Field of the Invention

The present invention relates generally to data compression, and in particular to methods and mechanisms for efficiently compressing and decompressing data in a lossless fashion.

2. Description of the Related Art

Compression techniques are utilized to reduce the amount of data that is transmitted, stored, or otherwise processed. Many of these data compression techniques look at the frequency of occurrence of various values and encode the most frequently used values with a shorter code and encode the infrequently used values with a longer code. Such an approach may be referred to as variable length encoding, and one type of variable length encoding is Huffman encoding. Huffman encoding is a lossless encoding scheme that is utilized in several compression standards (e.g., JPEG). While variable length encoding schemes can be effective, such techniques tend to be computationally costly and inefficient.

For example, Huffman encoding replaces variable-length sequences with shorter variable-length symbols. These shorter variable-length symbols reduce the size of the data, but also cause inefficiencies when performing the encoding and decoding of the data. For example, the decoder does not know the length of each symbol in advance, and so decoding cannot be performed in parallel for multiple symbols. Therefore, there is a need in the art for a faster, more efficient compression and decompression scheme.

SUMMARY

Systems and methods for performing computationally-efficient, lossless data compression and decompression are contemplated.

In one embodiment, a computing system includes a data storage medium and a data storage controller. The data storage controller may be configured to receive and compress data before writing the compressed data to the data storage medium. The data storage controller may also be configured to decompress the compressed data when the compressed data is retrieved from storage.

As part of the encoding process, the data storage controller may perform an analysis of given data. The analysis may include performing a frequency count of the occurrence of smaller, equal-sized blocks within the data. In one embodiment, the size of the smaller blocks may be one byte, and occurrence of byte-values within a data buffer may be tallied and sorted according to frequency of occurrence. In other embodiments, the size of the smaller, equal-sized blocks may be larger or smaller than one byte.

After performing a frequency count of the values of the smaller blocks, the smaller blocks with a frequency count above a threshold may be selected. These selected blocks may be encoded with unique fixed-length compression codes, while all other infrequently occurring blocks (below the threshold) may be encoded with one common fixed-length compression code. The compression codes may be organized in the compressed data buffer output according to the order of the smaller blocks within the original data buffer, and then following the compression codes, the infrequently occurring blocks may be included in the compressed data buffer output in their original, uncompressed form.

In another embodiment, the results of the frequency count may be utilized for analyzing various different ways of encoding the data within a buffer. For purposes of discussion, data within a buffer may be referred to herein as "data buffer". Several different encoding schemes may be considered, and the amount of compression may be determined and compared for the considered schemes. The various different encoding schemes may vary the number of bits per compression code, which determines the number of smaller block values that are encoded with unique compression codes, and the number of passes through the data buffer. The encoding scheme that achieves the best compression may be selected and utilized for the actual encoding of the data buffer.

The selected encoding scheme may be utilized to encode the original data buffer into a compressed data buffer. In one embodiment, the compressed data buffer may include a header, one or more masks, and an uncompressed data region. The header may include a value indicating the type of encoding scheme being utilized. The header may also include one or more lengths of the data buffer corresponding to one or more passes through the data buffer. The number of passes being performed, which may be indicated by the encoding scheme in the first part of the header, determines how many separate lengths are stored in the header. The header may also include one or more compression tables with values of the most frequently occurring blocks that are being encoded with unique compression codes.

Each mask may include a fixed-length compression code for each fixed-length segment of the original data buffer. Each fixed-length segment may be represented in the mask in the order of its appearance within the original data buffer. In one embodiment, as part of the encoding process of the data buffer, as each fixed-length segment is encountered while processing the data buffer, a table containing the most frequently occurring segments and their corresponding compression codes may be searched for the given value of the fixed-length segment. If the given value is found, then the corresponding compression code may be retrieved and inserted into the mask in place of the segment. If the given value is not found in the table, then the common compression code may be inserted into the mask in place of the segment. In one embodiment, a compression code value with all bits set to one (or some other reserved value) may be reserved to indicate that the segment is not in the table (i.e., the segment does not occur frequently within the original data buffer). Also, the actual full-length, uncompressed segment value may be added to the uncompressed region of the compressed buffer. After all of the segments of the original data buffer have been processed, then the compressed buffer may be written to a data storage medium.

These and other features and advantages will become apparent to those of ordinary skill in the art in view of the following detailed descriptions of the approaches presented herein.

BRIEF DESCRIPTION OF THE DRAWINGS

The above and further advantages of the methods and mechanisms may be better understood by referring to the following description in conjunction with the accompanying drawings, in which:

FIG. 7 is a block diagram that illustrates one embodiment of a frequency count table.

DETAILED DESCRIPTION OF EMBODIMENTS

Figure 1:
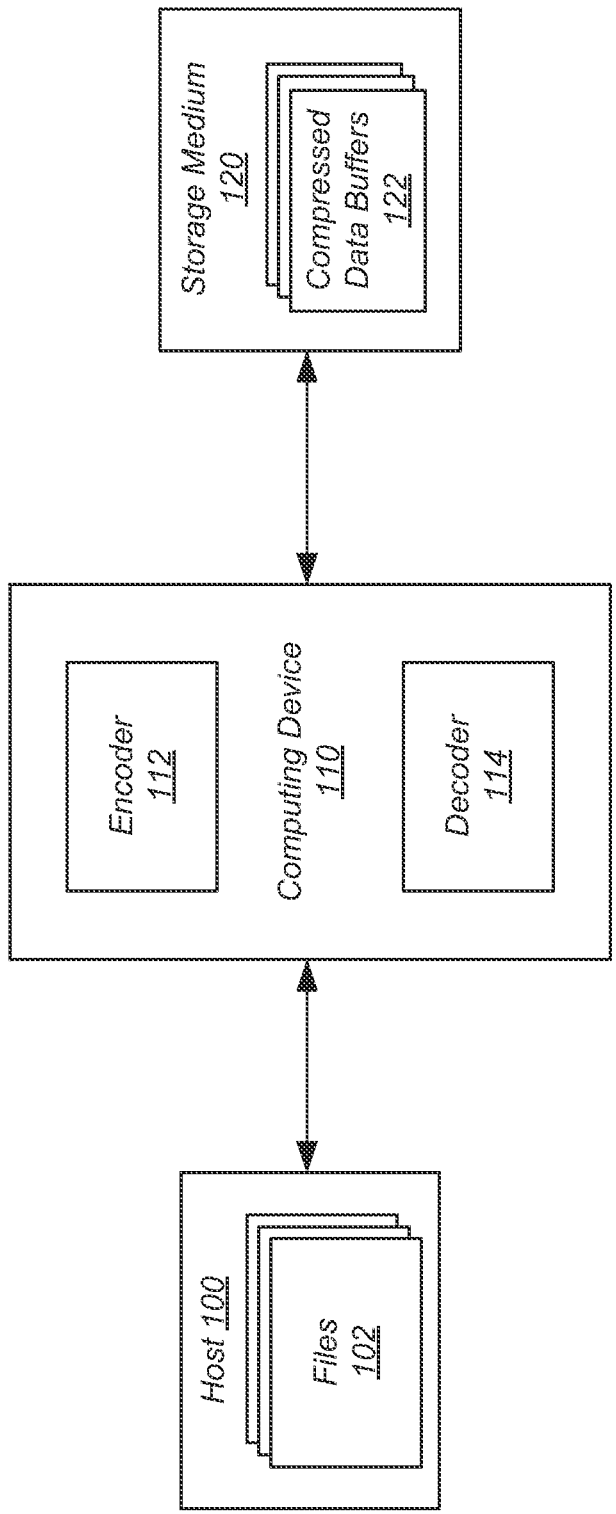
FIG. 1 illustrates one embodiment of a system for compressing data is shown.

In the following description, numerous specific details are set forth to provide a thorough understanding of the methods and mechanisms presented herein. However, one having ordinary skill in the art should recognize that the various embodiments may be practiced without these specific details. In some instances, well-known structures, components, signals, computer program instructions, and techniques have not been shown in detail to avoid obscuring the approaches described herein. It will be appreciated that for simplicity and clarity of illustration, elements shown in the figures have not necessarily been drawn to scale. For example, the dimensions of some of the elements may be exaggerated relative to other elements.

This specification includes references to "one embodiment". The appearance of the phrase "in one embodiment" in different contexts does not necessarily refer to the same embodiment. Particular features, structures, or characteristics may be combined in any suitable manner consistent with this disclosure. Furthermore, as used throughout this application, the word "may" is used in a permissive sense (i.e., meaning having the potential to), rather than the mandatory sense (i.e., meaning must). Similarly, the words "include", "including", and "includes" mean including, but not limited to.

Terminology. The following paragraphs provide definitions and/or context for terms found in this disclosure (including the appended claims):

"Comprising." This term is open-ended. As used in the appended claims, this term does not foreclose additional structure or steps. Consider a claim that recites: "A method comprising receiving a data buffer . . . " Such a claim does not foreclose the method from including additional steps.

"Configured To." Various units, circuits, or other components may be described or claimed as "configured to" perform a task or tasks. In such contexts, "configured to" is used to connote structure by indicating that the units/circuits/components include structure (e.g., circuitry) that performs the task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. §112, sixth paragraph, for that unit/circuit/component. Additionally, "configured to" can include generic structure (e.g., generic circuitry) that is manipulated by software and/or firmware (e.g., an FPGA or a general-purpose processor executing software) to operate in a manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

Turning now to FIG. 1, a generalized block diagram of one embodiment of a system for compressing data for storage is shown. Computing device 110 is coupled to host 100 over any type of direct or network connection. For example, a network connection may be any of a variety of connections including wireless connections, direct local area network (LAN) connections, wide area network (WAN) connections such as the Internet, a router, storage area network, Ethernet, as well as others. Host 100 is representative of any number of stationary or mobile computers such as desktop personal computers (PCs), servers, server farms, workstations, laptops, handheld computers, servers, personal digital assistants (PDAs), smart phones, and so forth. Host 100 may convey files 102 to computing device 110 for storage. To reduce storage utilization, computing device 110 may be configured to compress files 102 and/or other data (e.g., locally generated data) using encoder 112.

Computing device 110 may be coupled to storage medium 120 over any type of direct or network connection. Computing device 110 may be any type of computing device, such as a computer, server, storage controller, memory controller, or any other computing device. Computing device 110 may include many other hardware and software components not shown in FIG. 1. For example, computing device 110 may include deduplication software to perform deduplication of files, data chunks, or buffers stored in storage medium 120. Storage medium 120 is representative of any type (e.g., solid-state disk, flash, hard drive, tape) and number of storage devices. It is noted that in alternative embodiments, the number and type of hosts, computing devices, and storage media is not limited to those shown in FIG. 1.

Encoder 112 may be configured to encode (i.e., compress) data from files 102 received from host 100. In some embodiments, files 102 may be stored on storage medium 120 first and then compressed later by encoder 112. Encoder 112 may be implemented in a variety of ways, including through the use of hardware and/or software, depending on the embodiment. Encoder 112 may perform multiple types of encoding on each file 102 received from host 100. For example, in one embodiment, encoder 112 may encode a given file (or data buffer partitioned from a file) using Lempel-Ziv-Oberhumer (LZO) compression followed by the encoding schemes described herein. In another embodiment, encoder 112 may encode a given file or data buffer using the encoding schemes described herein followed by LZO compression. Generally speaking, the encoding methods and mechanisms presented herein may be used in a standalone manner or in combination with any number of other compression algorithms.

Decoder 114 may be configured to decode (i.e., decompress) data stored on storage medium 120 and to return the decoded data to host 100. Decoder 114 may be configured to reverse the encoding schemes implemented by encoder 112. Decoder 114 may be implemented in a variety of manners, including through the use of hardware and/or software, depending on the embodiment. For at least a portion of the decoding process, decoder 114 may be configured to decode compressed data buffers in a parallel fashion to facilitate a fast decoding. In addition, both encoder 112 and decoder 114 may be configured to simultaneously process multiple files or data buffers in parallel.

It is noted that the compression methods and mechanisms disclosed herein may be utilized in the system shown in FIG. 1 and/or in other systems and networks with other organizations and structures. Also, the compression schemes described herein may be utilized on any computing device whether or not that device is part of a network or storage system.

Figure 2:
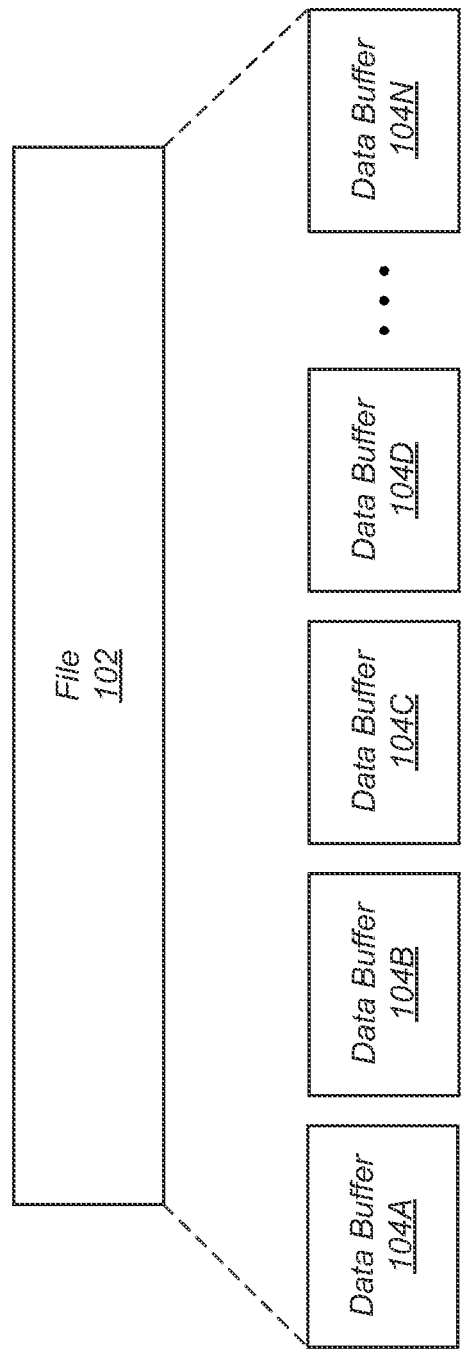
FIG. 2 is a block diagram that illustrates one embodiment of a file being partitioned as part of the encoding process.

Turning now to FIG. 2, a block diagram of a file being partitioned as part of the encoding process is shown. In one embodiment, file 102 may be conveyed to a computing device (not shown), such as a data storage controller, for storage. File 102 may be of any size. For example, in one embodiment, file 102 may be of size 1 gigabyte (GB). File 102 may be partitioned into smaller sized data buffers 104A-N. In one embodiment, each of data buffers 104A-N may be of size 16 kilobytes (though data buffers of other sizes are possible and are contemplated). File 102 may be broken up and partitioned, and prior to being stored, data buffers 104A-N may be compressed to reduce the storage utilization.

Each data buffer 104A-N from the original file may be processed and compressed using a lossless, aligned compression scheme. As part of the compression scheme, each data buffer 104A-N may be partitioned into a plurality of equal-size segments. The size of the segments may vary depending on the embodiment. In one embodiment, the size of each segment may be one byte. In other embodiments, the size of the segments may be larger or smaller than one byte.

Then, a census may be taken of the segments within a given data buffer. The most frequently occurring segments may be encoded with unique fixed-length codes, and the other less common segments may be encoded with a shared fixed-length code. A mask may be created with a fixed-length code for each of the segments in the buffer. Following the mask, the segments represented by the shared code may be written to a region of uncompressed segments, and the uncompressed segments may appear in the order in which they occur in the original buffer.

Figure 3:
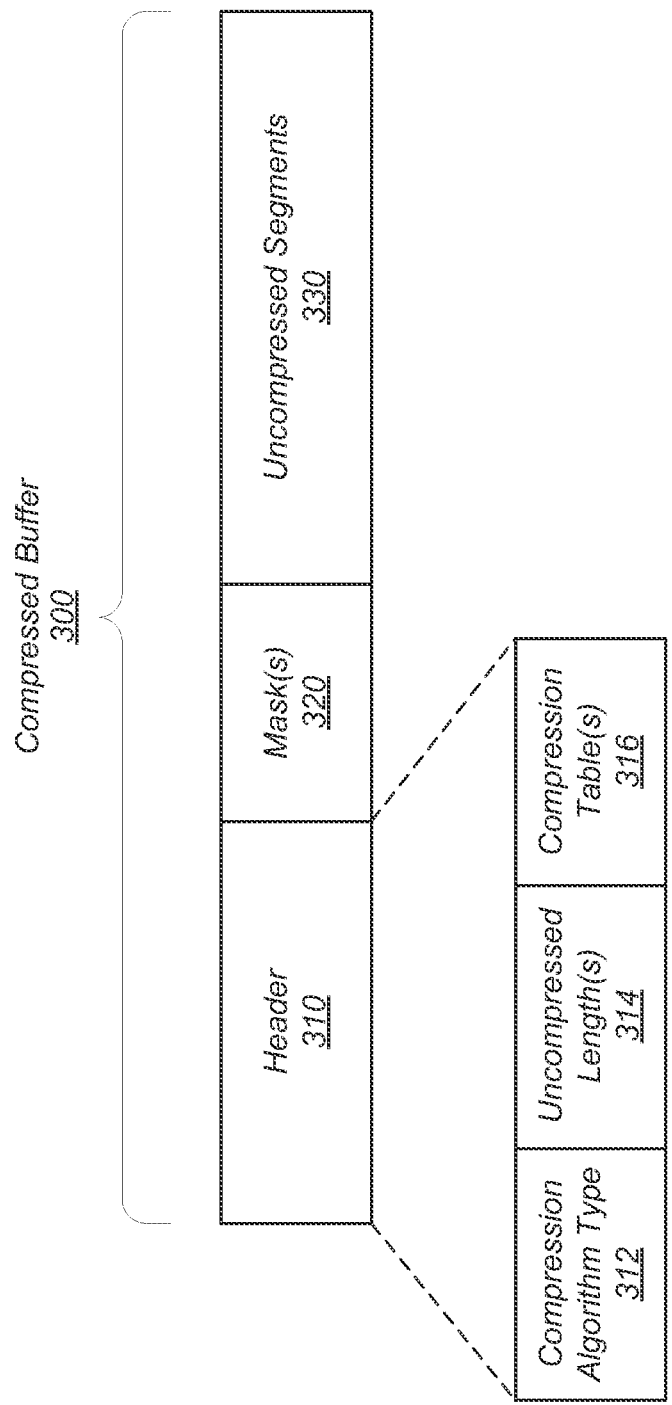
FIG. 3 is a block diagram illustrating one embodiment of a compressed buffer.

Referring now to FIG. 3, a block diagram of one embodiment of a compressed buffer is shown. Compressed buffer 300 includes a header 310, one or more masks 320, and uncompressed segments 330. Header 310 includes a compression algorithm type 312, uncompressed length(s) 314 representing the uncompressed lengths of the original data buffer for each pass, and compression table(s) 316.

For example, in one embodiment, compression algorithm type 312 may be "0x02" which indicates only a single pass through the original buffer is used and that the number of bits per compression code is two. In this case, the table 316 may have three entries. In another embodiment, compression algorithm type 312 may be "0x06", which indicates two passes are made through the original buffer. The value of "0x06" also may indicate that the first compression code has a length of one-bit and the second compression code has a length of two-bits. In this embodiment, compression tables 316 may include two tables, and the first table will have one entry and the second table will have three entries.

Header 310 is only one possible example of a header which may be utilized as part of a compressed buffer. In other embodiments, header 310 may be structured in other manners. For example, in another embodiment, header 310 may only include sizes of one or more masks and a size of the uncompressed segments. Also, in other embodiments, there may be more or fewer options for the types of compression that may be utilized, and header 310 may be adjusted accordingly depending on the different types of compression that may be employed.

Mask(s) 320 may include a mask for each pass through the original data buffer. If only one compression pass is utilized, then mask 320 may include the single mask for this single pass. In this case, mask 320 may include a compression code for each segment of the original data buffer. The original data buffer may be separated into a plurality of equal-sized segments for analysis and compression purposes. The most frequently occurring segments may be encoded with unique compression codes, and the infrequently occurring segments may be encoded with a shared compression code. Whether a given segment value is deemed to occur frequently or infrequently is a matter of design choice and may be determined by comparison to a given value. For example, if a value occurs at least N times, it is deemed to be frequently occurring. Otherwise, a value is deemed to occur infrequently. Alternatively, rather than comparing a number of occurrences to a given value, a value may be deemed to be frequent or infrequent based on its frequency relative to other values. For example, if a value in a buffer occurs at least ten times more frequently than a most infrequently occurring value in the buffer, it may be deemed to be frequently occurring. A variety of methods for deeming a value frequent or infrequent are possible and are contemplated. If more than one pass through the buffer is performed, then only the segments encoded with the shared compression code during the first pass may be included in the second mask. In the second mask, a new set of compression codes may be utilized to encode the uncompressed segments leftover from the first pass. Further passes may be utilized in some embodiments. The uncompressed segments 330 may contain any segments that were not encoded with unique compression codes during the one or more passes through the buffer, and these segments may be placed in the same order in which they appear in the original buffer.

The aligned structure of compressed buffer 300 may allow a decoder to efficiently decode compressed buffer 300. Since the mask 320 compression codes are aligned properly and the uncompressed data segments 330 are aligned properly, it may be faster for a decoder to retrieve them during the decoding process. The decoding process may utilize vectorization for decoding buffer 300, wherein multiple segment values are decoding in parallel. For example, multiple segment values may be read from mask 320 and used to quickly construct a list of uncompressed segment values to pull from compressed buffer 300 as well as pulling a set of compressed segment values from a vector register corresponding to compression table(s) 316. This parallel, vectorized decoding process may also be utilized with the other formats of compressed buffers described herein.

Figure 4:
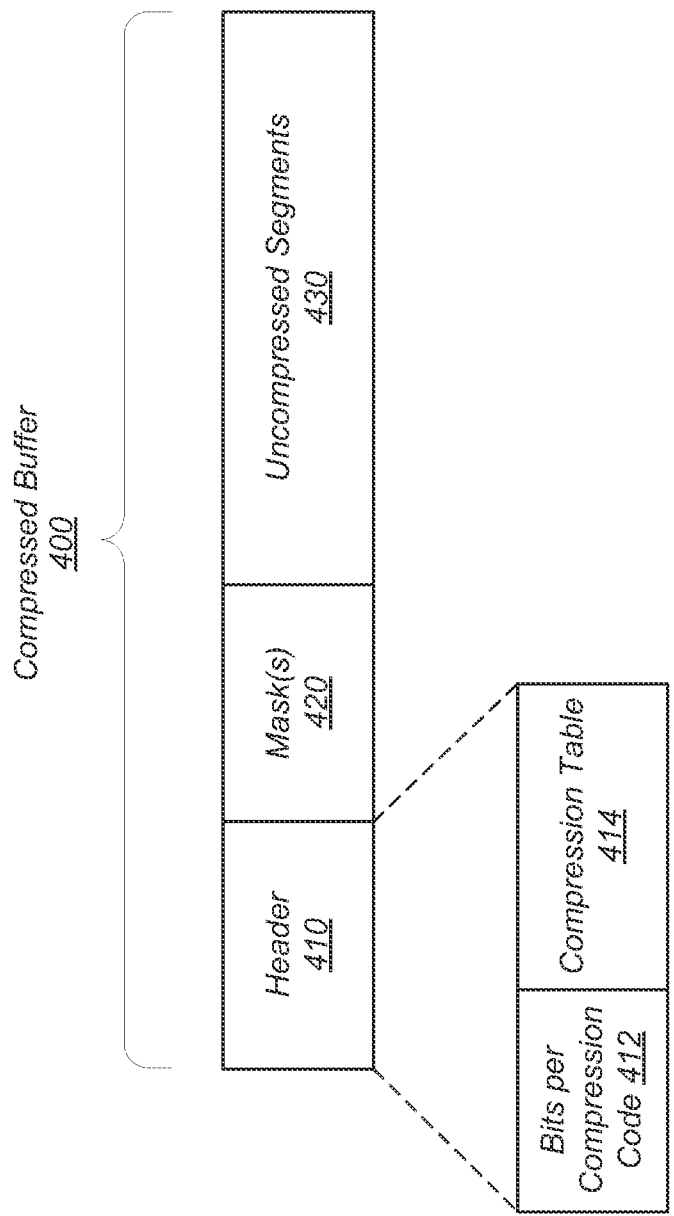
FIG. 4 is a block diagram illustrating another embodiment of a compressed buffer.

Turning now to FIG. 4, another embodiment of a compressed buffer is shown. The format of compressed buffer 400 may be used in some embodiments with specific types of operation conditions. In some embodiments, the size of an uncompressed buffer may be the same for all buffers. For example, all incoming files and data may be partitioned into 16 kilobyte (KB) data buffers. Therefore, in these embodiments, header 410 of compressed buffer 400 does not need to indicate the size of the uncompressed buffer since the size is always the same. Also, some embodiments may only make a single pass through the original buffer, and so only a single mask 420 may be needed for these embodiments. The format of header 410 may be used with these types of embodiments.

Therefore, header 410 may include bits per compression code 412, which may take up a fixed-size of space in header 410. For example, the size of field 412 may be 4 bits, which would allow the bits per compression code to range from 0 to 15 (0b0000 to 0b1111). The bits per compression code may determine the size of compression table 414. For example, if the compression codes are of size 1-bit, then table 414 will have a single segment value, represented by the compression code '0'. A compression code of '1' may be used to encode all other segment values. If the compression codes are of size 2-bits, then the table will have three segment values, and if the compression codes are of size 3-bits, then the table will have seven segment values, and this pattern may continue on to the maximum number of bits per compression code that is allowed by field 412. It is also noted that field 412 having a size of four-bits is only one example, and field 412 may be smaller or larger than four-bits in other embodiments.

Mask 420 and uncompressed segments 430 may be of similar structure as described for mask 320 and uncompressed segments 430 of FIG. 3. FIG. 4 provides an illustration of a different type of header 410 than header 310 of FIG. 3. It is noted that there may be many different types of headers used for the compressed buffers generated by the encoding schemes described herein. Also, it is possible for a compressed buffer to not include a header if the information typically included in the header is constant or can be determined by the encoder and decoder based on other information.

It is noted that compressed buffer 400 and header 410 are examples which may be utilized in one embodiment, and other embodiments may include other types of structures of the buffer and/or header. For example, other embodiments may vary the amount of passes made through the original data buffer depending on the results of a frequency count of segments within the data buffer. It is further noted that the individual components of compressed buffers and tables may be arranged in different orders in other embodiments. For example, in another embodiment, mask 420 may be the first component of compressed buffer 400, the uncompressed segments 430 may be the second component, and header 410 may be at the end of compressed buffer 400. Alternatively, uncompressed segments 430 may be the first component, mask 420 may be the second field, and table 410 may be the last field of compressed buffer 400. Other structures of compressed buffers are possible and are contemplated. It is further noted that both buffer compressed buffer 400 and header 410 may include additional fields in other embodiments.

Figure 5:
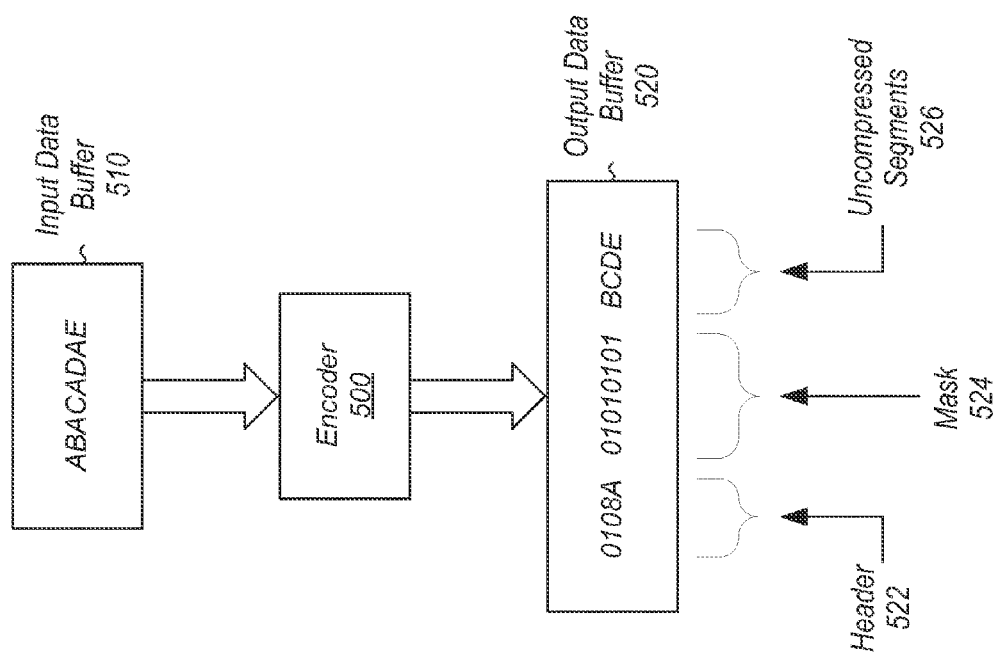
FIG. 5 is a block diagram that illustrates one embodiment of an input data buffer being encoded.

Referring now to FIG. 5, a block diagram of one embodiment of an input data buffer being encoded is shown. Input data buffer 510 is shown as containing the values "ABACADAE", which are used to depict one possible example for illustrative purposes. Each of the values A, B, C, and D shown in data buffer 510 may be a segment of size one-byte (eight bits). For example, although not shown in FIG. 5, each of the values may be represented by the following: A=0x41, B=0x42, C=0x43, and D=0x44. This is merely one example of the segment values represented by the letters A-D, and other types of representations may be used, depending on the embodiment.

To compress the data buffer 510, encoder 500 may parse data buffer 510 into one-byte segments. Other embodiments may utilize a segment size larger or smaller than one byte. Encoder 500 may analyze data buffer 510 and the frequency of occurrence of each of the bytes. As can be seen from the data in data buffer 510, the value 'A' occurs four times, while the other values each appear once. Therefore, for this distribution of data, a one-bit compression code may be selected, and the value 'A' may be encoded with a single bit '0'. Each of the other values, since they appear infrequently, may be encoded with the single bit value of '1'. As shown in compressed data buffer output 520, the mask is filled with eight separate bits, and each appearance of A in data buffer 510 generates a value of '0' in mask 524 and each appearance of any other value in data buffer 510 generates a value of '1' in mask 524.

Then, each uncompressed value represented by the value of '1' in mask 524 may be included in the uncompressed segments section 526 of the compressed output data buffer 520. Mask 524 and uncompressed segments 526 may be concatenated together in output data buffer 520. It is noted that while header 522 is shown in output data buffer 520, the type and structure of the header used at the beginning of output data buffer 520 may vary depending on the embodiment. Header 522 may include an indicator of the type of compression algorithm used "0x01", the size of the uncompressed data buffer 510 "0x08", and a table with the letter A.

Figure 6:
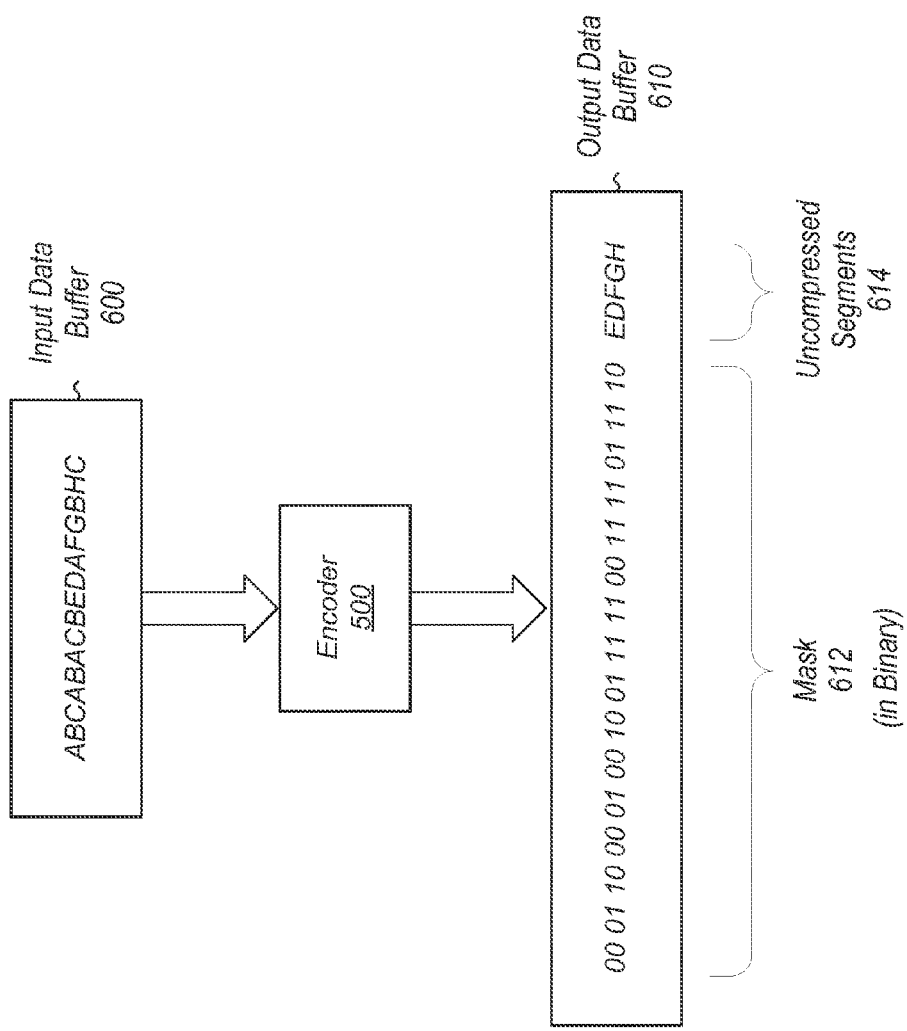
FIG. 6 is a block diagram that illustrates another embodiment of an input data buffer being encoded.

Turning now to FIG. 6, another embodiment of a data buffer being encoded is shown. Input data buffer 600 is shown in FIG. 6, and the values shown may be a portion or the entirety of a data buffer, depending on the embodiment. The values shown are for illustrative purposes only. In other embodiments, data buffer 600 may include larger amounts of data but may still be processed in a similar manner to that shown in FIG. 6. Encoder 500 may receive data buffer 600, and then encoder 500 may parse the data in data buffer 600 into equal-sized segments and then take a census on the frequency of occurrence of the segments within data buffer 600.

As shown in FIG. 7, frequency count 700 may be generated as part of the parsing and analysis of data buffer 600. Then, an encoding scheme may be selected based on the results of frequency count 700. As can be seen in the results in frequency count 700, A, B, and C appear more frequently than the other values. Therefore, each of these three values may be encoded with unique compression codes in the mask. In other words, a threshold of two may be utilized for the results of frequency count 700, such that all values that appear more than two times may be encoded with a unique compression code. Then, all other values may be encoded with a compression code of '11' and the uncompressed segments may be included in section 614 of output data buffer 610. Also, the values of A, B, and C may be included in a compression table in a header (not shown) within compressed output data buffer 610.

It is noted that the analysis performed after generating frequency count 700 may determine the amount of compression that can be achieved for several different types of compression. The different types of compression may vary the number of bits per mask compression code, may vary the threshold, and may vary the number of passes through the data. The number of bits per mask compression code determines the number of segments that may be encoded with a unique compression code. For example, if there are two bits per compression code, then three segment values may be encoded with a unique compression code, and the fourth compression code may be reserved for all other infrequently occurring segment values. If there are three bits per compression code, then seven segment values may be encoded with a unique compression code, and the eighth compression code may be reserved for all other infrequently occurring segment values. This pattern can be continued for any number of bits that are used to encode the compression codes. Therefore, if the bits per compression code is indicated in the header, as part of the compression algorithm indicator, then the size of the table can be determined from this information, as described in the above examples. A plurality of different types of compression may be analyzed, and the type of compression that achieves the best compression may be selected and utilized to encode data buffer 600.

As is shown in mask 612, each value in data buffer 600 is replaced with a corresponding compression code. The value of A is encoded with compression code '00', B is encoded with code '01', C is encoded with code '10', and all other values are encoded with code '11'. It is noted that the order of each segment value in data buffer 600 is preserved in mask 612 for the corresponding compression codes. Similarly, the uncompressed segments 614 include the uncompressed segment values of data buffer 600 (segment values encoded with '11') in the order they appear in data buffer 600. Although a header is not shown as part of output data buffer 610, it is noted that any type of suitable header may be included within output data buffer 610.

Figure 8:
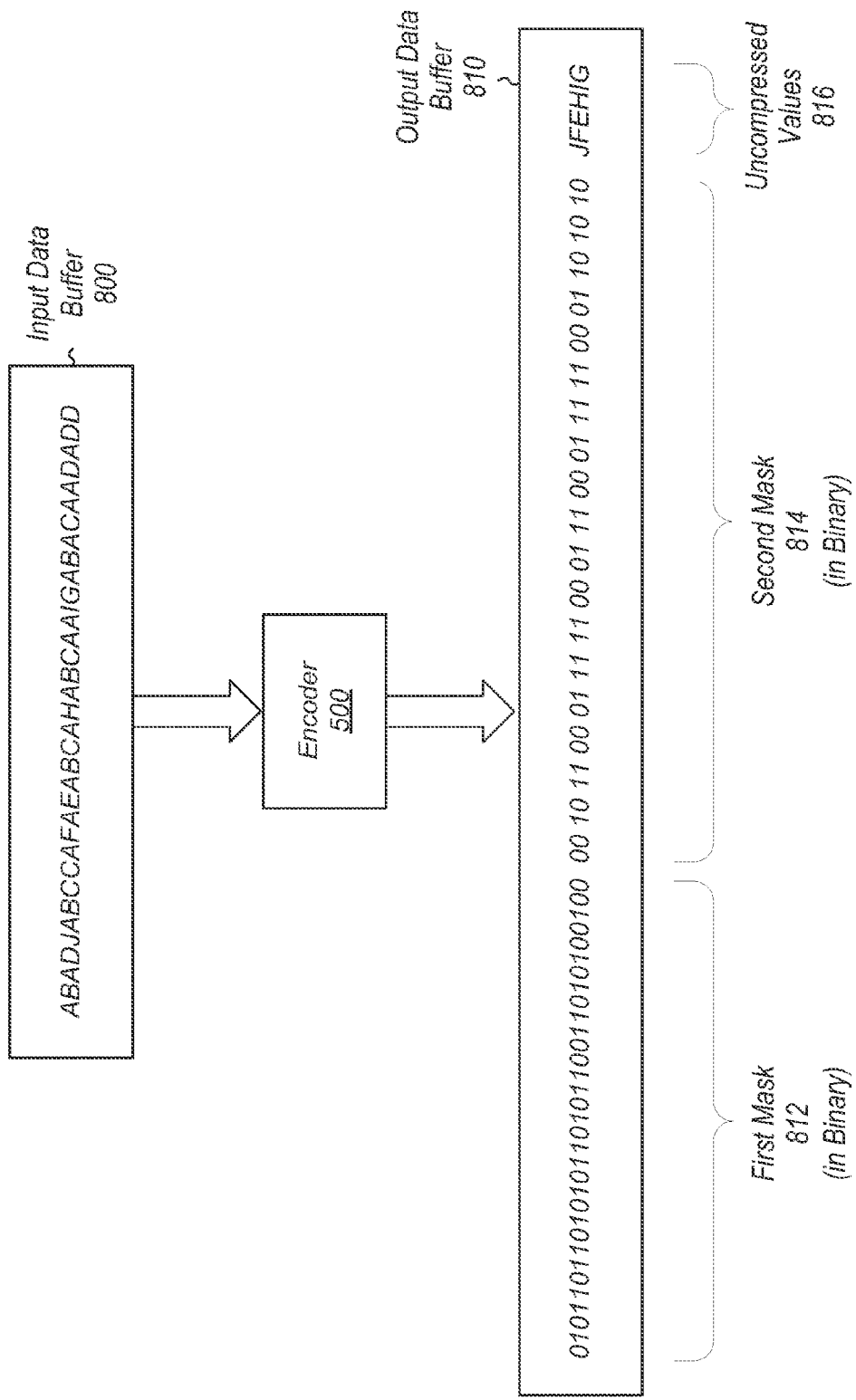
FIG. 8 is a block diagram that illustrates another embodiment of an input data buffer being encoded.

Turning now to FIG. 8, another embodiment of a data buffer being encoded is shown. Input data buffer 800 is shown in FIG. 8, input data buffer 800 may be conveyed to encoder 500. The data in input data buffer 800 may be analyzed and a frequency count may be generated from the segments of input data buffer 800. Data buffer 800 may be separated into one-byte segments, and the frequency count may count the appearance of the one-byte segments within data buffer 800. In other embodiments, a data buffer may be separated into segments of other sizes (e.g., two bytes, four bytes) and the frequency count may be generated based on the appearances of these other segment sizes. The letters A-J shown in FIG. 8 represent one-byte segments and these letters are used for illustrative purposes only. It is to be understood that each letter is considered to take up one byte.

After a frequency count is generated, then encoder 500 may determine the type of compression to use for compressing input data buffer 800. Encoder 500 may consider several different types of compression and then determine how much compression is attained by each different type of compression algorithm. Then, encoder 500 may select the compression type that achieves the best type of compression. In some embodiments, if no compression of input data buffer 800 can be attained by any of the compression algorithms, then encoder 500 may choose not compress input data buffer 800.

Encoder 500 may consider using one pass through data buffer 800, and may calculate the size of the resultant buffer based on the results of the frequency count. For example, for a single pass through data buffer 800, and with a compression code of size 1-bit, with a '0' used to represent 'A' and a '1' to represent all other symbols, then the table may be of size 1 byte (8 bits), the mask may be of size 34 bits (one bit per each of the 34 segments), and then the uncompressed segment section may be of size 19 bytes (152 bits) for the 19 segments that were encoded with a '1'. The total bits in the compressed buffer for this type of encoding scheme would then be 194 bits. This total number of bits factors in the bits used for the table but excludes the number of bits in the header used for indicators other than the table. It may be assumed for this example that the number of bits in the other portions of the header may be equal for the other compression schemes considered. The total number of bits for this scheme may be calculated based on the results of the frequency count without having to actually perform the compression.

Other compression schemes may also be considered. For example, a single pass with a compression code of size two-bits may be considered. A compression code of '00' may be used to represent 'A', a compression code of '01' may be utilized to represent 'B', a compression code of '10' may be utilized to represent 'C', and a compression code of '11' may be utilized to represent all other symbols/letters. For this compression scheme, the compression table may be of size three bytes (24 bits), the mask may be of size 68 bits (two bits for each of the 34 segments), and the uncompressed segment section may be of size 10 bytes (80 bits). The total bits in the compressed buffer for this type of encoding scheme would then be 172 bits (excluding any other parts of the header besides the table). So this scheme is an improvement over the previously described scheme, which had a compressed buffer size of 194 bits.

Another example of a compression scheme that may be considered utilizes two passes through the data in data buffer 800. In this two-pass scheme, the first pass may encode the symbol 'A' with a '0' and encode all other symbols with a '1'. Then, on a second pass through the other symbols leftover from the first pass, the symbol 'B' may be encoded with the compression code '00', the symbol 'C' may be encoded with '01', the symbol 'D' may be encoded with '10', and all other symbols may be encoded with '11'. This scheme is illustrated in compressed data buffer 810. With this scheme, the size of the compressed data buffer 810, excluding any additional header data, is one byte for the first table (A') (not shown), three bytes for the second table (B', 'C', and 'D') (not shown), 34 bits for the first mask 812, 38 bits for the second mask 814, and six bytes (48 bits) for the uncompressed values 816. The total for the compressed data buffer 810 then is 152 bits (excluding other parts of the header), which is an improvement over the two previously considered compression schemes. In the second mask 814, the spaces shown between adjacent mask compression codes are for illustrative purposes only.

When compressed data buffer 810 is requested and needs to be decompressed, the decoding process is much simpler than for a typical encoding scheme using variable-length compression codes. Although not shown in FIG. 8, any suitable header may be used for compressed data buffer 810. The length of each mask may be determined from the header, and the length of the uncompressed segments at then end of buffer 810 may also be determined from the mask(s). Since there is a fixed-length compression code at each position in each mask, then the locations of each of the individual compression codes within the buffer may be known in advance without the need to examine the compression code values. Accordingly, the algorithm may then load a set of compression codes. In this manner, the decoding process is simplified and can be vectorized to allow for the decoding process to be performed quickly and efficiently.

Several other variations of compression schemes may be considered and compared to those above. Other compression schemes to be considered may make additional passes through data buffer 800, such as three passes, four passes, and so on. There are many different types of compression schemes that can be considered, such as by altering the number of bits per compression code and number of passes, and depending on the embodiment, encoder 500 may consider as many or as few compression schemes as deemed appropriate. It is noted that other input data buffers may include many more segments and have a different distribution of segment values than that shown in this example. If none of the considered compression schemes achieves a reduction in the size of data buffer 800, then encoder 500 may choose not to encode data buffer 800. In that case, data buffer 800 may be stored with a header that indicates that the data in the buffer has not been encoded.

Figure 9:
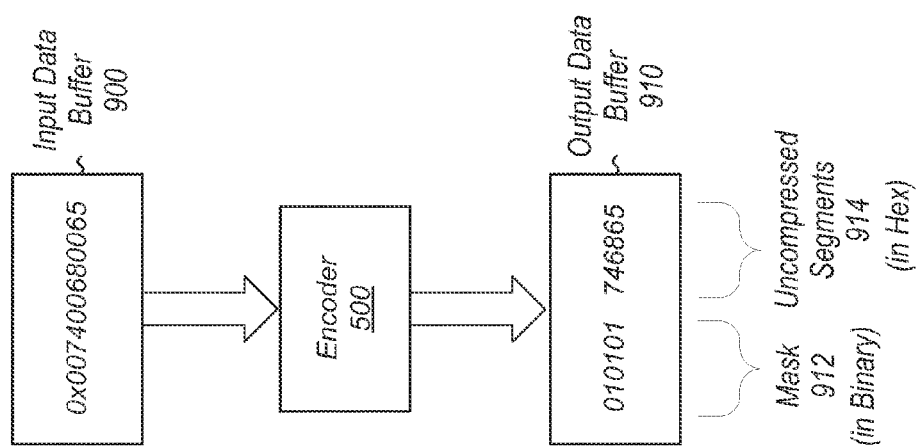
FIG. 9 is a block diagram that illustrates another embodiment of an input data buffer being encoded.

Referring now to FIG. 9, another embodiment of a data buffer being encoded is shown. Input data buffer 900 is representative of the string "the" encoded in a Unicode format. The value of 't' in Unicode format is "0x0074", the value of 'h' is "0x0068", and the value of e' is "0x0065". Each of the Unicode values is of size two bytes (for UTF-16).

If data buffer 900 is partitioned into byte-size segments, it can be seen that the byte "0x00" is used three separate times in data buffer 900. These zero bytes may be encoded with a '0' compression code and the other bytes may be encoded with '1' in mask 912. The uncompressed bytes may be included within uncompressed segments 914. Although not shown in FIG. 9, compressed output data buffer 910 may also include any type of suitable header. For a larger input data buffer, with additional characters represented in Unicode format, the occurrence of "0x00" bytes will likely be much higher, and the amount of compression that can be attained will likewise increase.

In some embodiments, considerable amounts of data represented in a Unicode format may be stored in a storage system, and the data may be compressed prior to storage. As can be seen from FIG. 9, a significant amount of compression can be attained by compressing the appearances of the "0x00" value in the Unicode characters. This is one example of the usefulness of the encoding schemes presented herein. These encoding mechanisms and methods are also useful with other types of data and other character formats, and the example shown in FIG. 9 is merely one illustration of a type of data that may be efficiently compressed with these mechanisms and methods.

Figure 10:
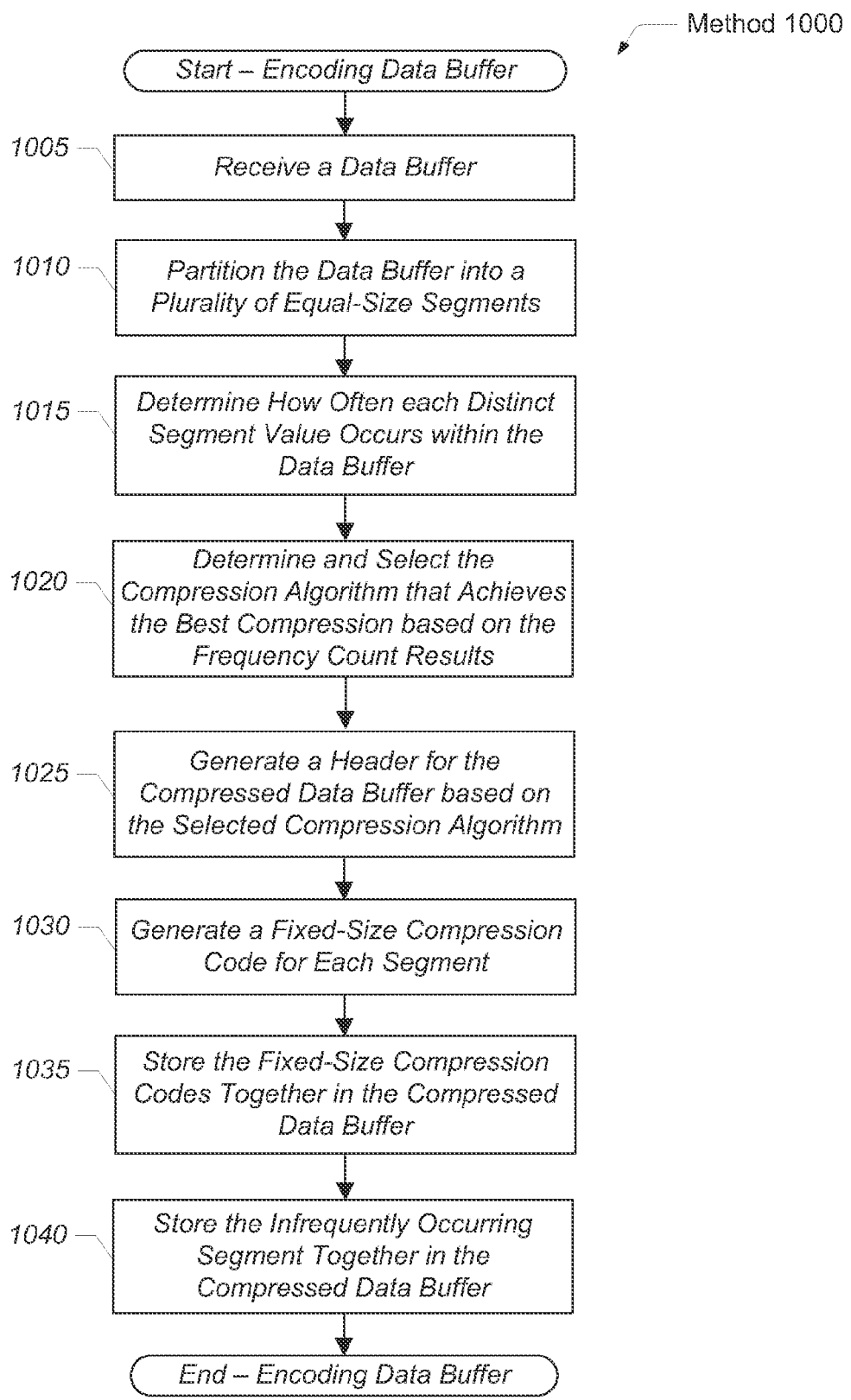
FIG. 10 is a generalized flow diagram illustrating one embodiment of a method for encoding a data buffer.

Turning now to FIG. 10, one embodiment of a method 1000 for encoding a data buffer is shown. For purposes of discussion, the steps in this embodiment are shown in sequential order. It should be noted that in various embodiments of the method described below, one or more of the elements described may be performed concurrently, in a different order than shown, or may be omitted entirely. Other additional elements may also be performed as desired.

In one embodiment, a data buffer may be received by an encoder (block 1005). The encoder may be configured to compress the data buffer, and the encoder may comprise hardware and/or software depending on the embodiment. The encoder may partition the data buffer into a plurality of equal-size segments (block 1010). In one embodiment, each segment may be one byte in size. Then, the encoder may determine how often each segment value occurs in the data buffer (block 1015). In other words, the encoder may perform a frequency count of each segment that appears in the data buffer. Based on the frequency count results, the encoder may determine and select the compression algorithm out of plurality of compression algorithms that achieves the best compression (block 1020). The different compression algorithms that are considered may vary the number of passes through the data buffer, the number of bits per compression code, and other attributes. The size of the resultant compressed buffer that would be generated by each compression algorithm may be calculated based on the frequency count results, and the algorithm that would produce the smallest compressed buffer may be selected.

After the best compression algorithm is selected, a header may be generated for the compressed data buffer based on the selected algorithm (block 1025). In one embodiment, the header may include a compression algorithm type indicator, a size of the uncompressed data buffer for each pass, and one or more compression tables. In other embodiments, the header may be formatted differently. Then, a fixed-length compression code may be generated for each segment of the original data buffer (block 1030). The fixed-length compression codes may be generated in the order in which each segment appears in the original data buffer. One advantage of using fixed-length compression codes is that this allows the decoder to easily align the compression codes during the decoding process. The fixed-length compression codes may be bundled together and stored in the compressed data buffer after the header (block 1035). An advantage of storing fixed-length compression codes together is that this allows the decoder to fetch a set of compression codes in a single memory access without intervening uncompressed segments, allowing the compression codes to be processed in parallel. The section of the compressed data buffer containing the fixed-length compression codes may be referred to as a mask.

One of the fixed-length compression codes may be reserved for the infrequently occurring segments of the original data buffer. Each time one of the less common segments appears in the original data buffer, the reserved compression code may be inserted into the mask in place of the segment. Then, the infrequently occurring segments may be bundled together and stored in the compressed data buffer after the mask (block 1040). The infrequently occurring segments may be stored in their original, uncompressed form. Since the infrequently occurring segments may be grouped together without additional information such as compression codes between them, the infrequently occurring segments remain well-aligned in memory and the need for bit shifts or other data alignment operations to recover values may be eliminated. In other embodiments, additional passes may be made through the uncompressed segments of the compressed data buffer. Each additional pass may encode the uncompressed segments with a new set of fixed-length compression codes, and then the least frequently occurring of these uncompressed segments may be affixed to the new mask. The number of passes that are utilized may be determined by the selected compression algorithm.

Figure 11:
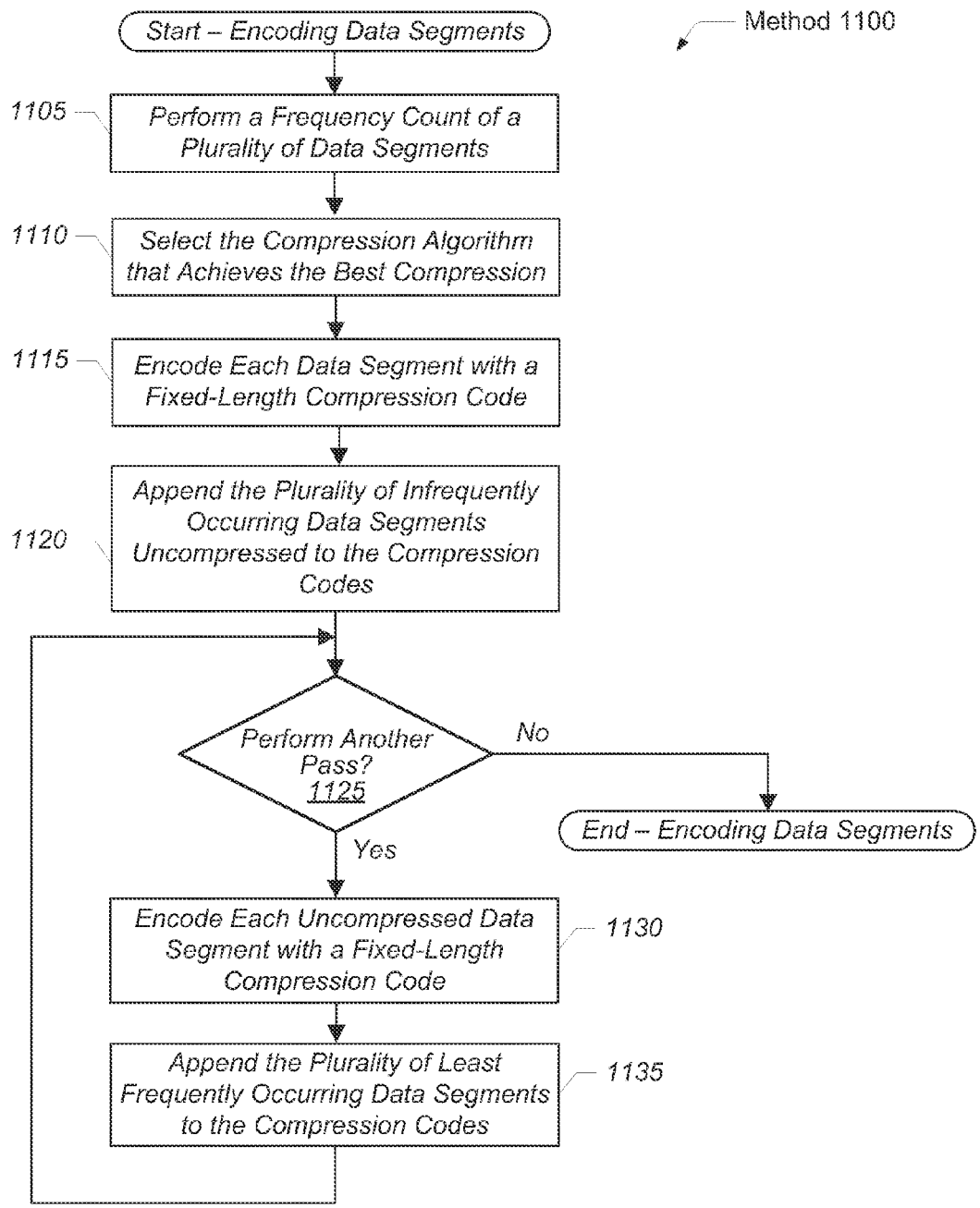
FIG. 11 is a generalized flow diagram illustrating one embodiment of a method for encoding a plurality of data segments.

Referring now to FIG. 11, one embodiment of a method 1100 for encoding a plurality of data segments is shown. For purposes of discussion, the steps in this embodiment are shown in sequential order. It should be noted that in various embodiments of the method described below, one or more of the elements described may be performed concurrently, in a different order than shown, or may be omitted entirely. Other additional elements may also be performed as desired.

In one embodiment, a frequency count may be performed for a plurality of data segments (block 1105). The frequency count may be performed by any type of computing device. In one embodiment, a data storage controller may perform the frequency count, and the data storage controller may be configured to compress the plurality of data segments prior to storing them. Each data segment of the plurality of data segments may be the same size. In one embodiment, each data segment may be of size one-byte, although other embodiments may utilize other sizes of data segments. A plurality of compression algorithms may be analyzed based on the frequency count, and the compression algorithm that can achieve the best compression may be selected (block 1110).

Then, using the selected compression algorithm, each data segment may be encoded with a fixed-length compression code (block 1115). Using the selected compression algorithm, a table may be created with data segments and their corresponding compression codes. As part of the process of encoding a data segment, the table may be searched for the data segment, and if the data segment is found, then the corresponding compression code may be inserted in place of the data segment in the mask portion of a compressed data buffer. If the data segment is not found in the table, then a reserved, common compression code may be inserted in place of the data segment in the mask portion of the compressed data buffer. In general, the most frequently occurring data segments will have assigned, unique compression codes in the table, while the less frequently occurring data segments will not appear in the table but instead will be encoded with the common compression code. In one embodiment, the common compression code may be the code with all of its bits set to one, though any other suitable value may be used.

Next, the plurality of infrequently occurring data segments may be appended in their original, uncompressed format to the compression codes (block 1120). Then, it may be determined if another pass will be made through the uncompressed data segments in the compressed buffer (conditional block 1125). This may be determined by the compression algorithm being used to encode the plurality of data segments. If another pass will be made through the uncompressed data segments (conditional block 1125), then each uncompressed data segment may be encoded with a new fixed-length compression code (block 1130). It is noted that in various embodiments, the census from previous passes may be reused in subsequent passes. For example, the first k entries may simply be skipped since it is known they were removed in previous passes. The uncompressed data segments that were appended to the mask in block 1120 may be stripped off and removed and replaced by these new fixed-length compression codes. Alternatively, the uncompressed data segments need not be appended. Rather, they may simply be reprocessed. Then, the least frequently occurring data segments may be appended in uncompressed form to these new fixed-length compression codes (block 1135). The least frequently occurring data segments are the data segments that are not assigned unique compression codes in the first two passes. If two passes are made through the buffer, then two masks will be next to each other in the generated compressed buffer followed by the remaining uncompressed data segments. If three passes are made through the buffer, then three masks will be next to each other in the compressed buffer followed by any remaining uncompressed data segments. This pattern may be repeated for any number of passes through the buffer. After block 1135, method 1100 may return to conditional block 1125 to determine if another pass through the buffer will be performed. If no more passes will be made through the buffer (conditional block 1125), then method 1100 may end.

It is noted that the above-described embodiments may comprise software. In such an embodiment, the program instructions that implement the methods and/or mechanisms may be conveyed or stored on a non-transitory computer readable medium. Numerous types of media which are configured to store program instructions are available and include hard disks, floppy disks, CD-ROM, DVD, flash memory, Programmable ROMs (PROM), random access memory (RAM), and various other forms of volatile or non-volatile storage.

In various embodiments, one or more portions of the methods and mechanisms described herein may form part of a cloud-computing environment. In such embodiments, resources may be provided over the Internet as services according to one or more various models. Such models may include Infrastructure as a Service (IaaS), Platform as a Service (PaaS), and Software as a Service (SaaS). In IaaS, computer infrastructure is delivered as a service. In such a case, the computing equipment is generally owned and operated by the service provider. In the PaaS model, software tools and underlying equipment used by developers to develop software solutions may be provided as a service and hosted by the service provider. SaaS typically includes a service provider licensing software as a service on demand. The service provider may host the software, or may deploy the software to a customer for a given period of time. Numerous combinations of the above models are possible and are contemplated.

It should be emphasized that the above-described embodiments are only non-limiting examples of implementations. Numerous variations and modifications will become apparent to those skilled in the art once the above disclosure is fully appreciated. It is intended that the following claims be interpreted to embrace all such variations and modifications.

What is claimed is:

1. A method comprising:
   partitioning an original data buffer into a plurality of segments;
   generating a fixed-length compression code for each segment of the plurality of segments;
   assigning a unique compression code to represent first segment values responsive to determining a first condition is met; and
   assigning a common compression code to represent second segment values responsive to determining a second condition is met.

2. The method as recited in claim 1, further comprising storing each unique compression code and each common compression code in a compressed data buffer, wherein the plurality of segments partitioned from the original data buffer are equal-sized.

3. The method as recited in claim 1, wherein determining said first condition is met comprises determining said first segment values occur more than a given number of times in the original data buffer.

4. The method as recited in claim 3, further comprising storing an identification of each first segment value occurring more than the given number of times with a corresponding unique compression code.

5. The method as recited in claim 1, further comprising storing an indication of a size of the common compression code within a compressed data buffer.

6. The method as recited in claim 1, wherein determining said second condition is met comprises determining said second segment values occur fewer than a given number of times within the original data buffer.

7. The method as recited in claim 1, further comprising storing a header in a compressed data buffer, wherein the header comprises a compression algorithm type indicator.

8. A method comprising:
   determining a level of compression that can be achieved for an original data buffer by each of a plurality of compression algorithms based at least in part on a first condition; and
   selecting, from the plurality of compression algorithms, a given compression algorithm based at least in part on said determining.

9. The method as recited in claim 8, further comprising performing a frequency count of how often each segment of a plurality of segments appears in an original data buffer, wherein the first condition is the frequency count.

10. The method as recited in claim 9, further comprising:
generating a first fixed-size compression code for each segment of the original data buffer for a first pass through the original data buffer using the given compression algorithm;
generating a compressed data buffer from the original data buffer using the given compression algorithm; and
generating a header for the compressed data buffer based on the given compression algorithm.

11. The method as recited in claim 10, wherein the first fixed-size compression codes are stored in the compressed data buffer in an order matching corresponding segments in the original data buffer.

12. The method as recited in claim 10, further comprising utilizing a common first fixed-size compression code for segments of the original data buffer.

13. The method as recited in claim 12, further comprising generating a second fixed-size compression code for each segment during a second pass through segments which utilized the common first fixed-sized compression code.

14. The method as recited in claim 13, further comprising:
creating a first table with one or more first segments and corresponding first fixed-size compression codes;
creating a second table with one or more second segments and corresponding second fixed-size compression codes; and
storing the first table and the second table with the compressed data buffer.

15. A non-transitory computer readable storage medium comprising program instructions, wherein said program instructions are executable to:
partition an original data buffer into a plurality of segments;
generate a fixed-length compression code for each segment of the plurality of segments;
assign a unique compression code to represent first segment values responsive to determining a first condition is met; and
assign a common compression code to represent second segment values responsive to determining a second condition is met.

16. The non-transitory computer readable storage medium as recited in claim 15, wherein said program instructions are further executable to store each unique compression code and each common compression code in a compressed data buffer, wherein the plurality of segments partitioned from the original data buffer are equal-sized.

17. The non-transitory computer readable storage medium as recited in claim 15, wherein determining said first condition is met comprises determining said first segment values occur more than a given number of times in the original data buffer.

18. The non-transitory computer readable storage medium as recited in claim 17, wherein said program instructions are further executable to store an identification of each first segment value occurring more than the given number of times with a corresponding unique compression code.

19. The non-transitory computer readable storage medium as recited in claim 15, wherein said program instructions are further executable to store an indication of a size of the common compression code within a compressed data buffer.

20. The non-transitory computer readable storage medium as recited in claim 15, wherein determining said second condition is met comprises determining said second segment values occur fewer than a given number of times within the original data buffer.

21. A system comprising:
a storage medium; and
an encoder configured to compress data, wherein said encoder is configured to:
partition an original data buffer into a plurality of segments;
generate a fixed-length compression code for each segment of the plurality of segments;
assign a unique compression code to represent first segment values responsive to determining a first condition is met; and
assign a common compression code to represent second segment values responsive to determining a second condition is met.

* * * * *